US012622013B2

(12) United States Patent
Huang et al.

(10) Patent No.: US 12,622,013 B2
(45) Date of Patent: May 5, 2026

(54) FOLDED CHANNEL GALLIUM NITRIDE BASED FIELD-EFFECT TRANSISTOR AND METHOD OF MANUFACTURING THE SAME

(71) Applicant: INSTITUTE OF MICROELECTRONICS, CHINESE ACADEMY OF SCIENCES, Beijing (CN)

(72) Inventors: Sen Huang, Beijing (CN); Qimeng Jiang, Beijing (CN); Xinyue Dai, Beijing (CN); Xinhua Wang, Beijing (CN); Xinyu Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 374 days.

(21) Appl. No.: 18/238,947

(22) Filed: Aug. 28, 2023

(65) Prior Publication Data

US 2024/0355921 A1 Oct. 24, 2024

(30) Foreign Application Priority Data

Apr. 21, 2023 (CN) .......................... 202310431333.9

(51) Int. Cl.
| | |
|---|---|
| *H10D 30/47* | (2025.01) |
| *H10D 30/01* | (2025.01) |
| *H10D 62/13* | (2025.01) |
| *H10D 64/00* | (2025.01) |

(Continued)

(52) U.S. Cl.
CPC ......... *H10D 30/478* (2025.01); *H10D 30/015* (2025.01); *H10D 30/4732* (2025.01); *H10D 30/475* (2025.01); *H10D 62/13* (2025.01); *H10D 64/111* (2025.01);

(Continued)

(58) Field of Classification Search
None
See application file for complete search history.

(56) References Cited

U.S. PATENT DOCUMENTS

| | | | |
|---|---|---|---|
| 2019/0288101 A1* | 9/2019 | Longobardi | ......... H10D 62/106 |
| 2021/0343839 A1* | 11/2021 | Hao | ..................... H10D 62/124 |
| 2024/0162298 A1* | 5/2024 | He | ....................... H10D 30/015 |

(Continued)

*Primary Examiner* — Julio J Maldonado
*Assistant Examiner* — Pinaki Das
(74) *Attorney, Agent, or Firm* — Merchant & Gould P.C.

(57) ABSTRACT

The folded channel gallium nitride based field-effect transistor includes: a base layer; a multi-heterojunction layer, including a channel layer and a barrier layer alternatingly stacked from bottom to top on a gallium nitride semi-insulating layer; a gallium nitride control layer on the multi-heterojunction layer and extending from one side of the channel region to at least a part of the groove; a current collapse suppression structure formed on the multi-heterojunction layer on another side of the channel region; a source electrode and a drain electrode that are respectively in contact with two sides of the multi-heterojunction layer on the gallium nitride semi-insulating layer; a gate electrode formed on the multi-heterojunction layer between the source electrode and the gallium nitride control layer; and a connecting structure passing over the gate electrode to electrically connect to the source electrode and the gallium nitride control layer.

8 Claims, 9 Drawing Sheets

(51) Int. Cl.
    H10D 64/23          (2025.01)
    H10D 64/27          (2025.01)

(52) U.S. Cl.
    CPC ......... H10D 64/251 (2025.01); H10D 64/513
               (2025.01); *H10D 64/112* (2025.01)

(56)               References Cited

U.S. PATENT DOCUMENTS

2024/0413234 A1* 12/2024 Zuniga ................. H10D 30/475
2024/0421194 A1* 12/2024 Lai ......................... H10D 64/01

\* cited by examiner

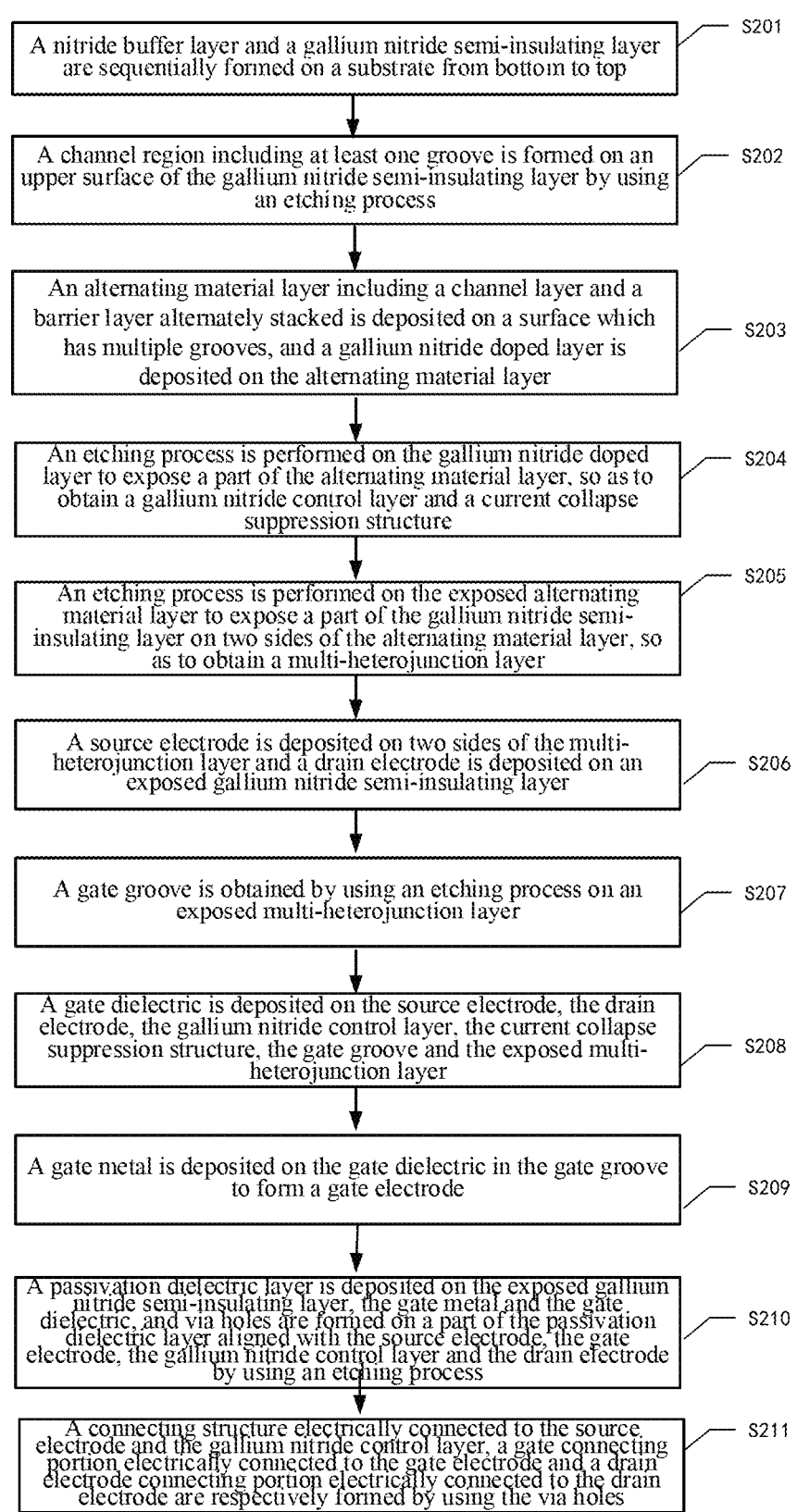

A nitride buffer layer and a gallium nitride semi-insulating layer are sequentially formed on a substrate from bottom to top — S201

A channel region including at least one groove is formed on an upper surface of the gallium nitride semi-insulating layer by using an etching process — S202

An alternating material layer including a channel layer and a barrier layer alternately stacked is deposited on a surface which has multiple grooves, and a gallium nitride doped layer is deposited on the alternating material layer — S203

An etching process is performed on the gallium nitride doped layer to expose a part of the alternating material layer, so as to obtain a gallium nitride control layer and a current collapse suppression structure — S204

An etching process is performed on the exposed alternating material layer to expose a part of the gallium nitride semi-insulating layer on two sides of the alternating material layer, so as to obtain a multi-heterojunction layer — S205

A source electrode is deposited on two sides of the multi-heterojunction layer and a drain electrode is deposited on an exposed gallium nitride semi-insulating layer — S206

A gate groove is obtained by using an etching process on an exposed multi-heterojunction layer — S207

A gate dielectric is deposited on the source electrode, the drain electrode, the gallium nitride control layer, the current collapse suppression structure, the gate groove and the exposed multi-heterojunction layer — S208

A gate metal is deposited on the gate dielectric in the gate groove to form a gate electrode — S209

A passivation dielectric layer is deposited on the exposed gallium nitride semi-insulating layer, the gate metal and the gate dielectric, and via holes are formed on a part of the passivation dielectric layer aligned with the source electrode, the gate electrode, the gallium nitride control layer and the drain electrode by using an etching process — S210

A connecting structure electrically connected to the source electrode and the gallium nitride control layer, a gate connecting portion electrically connected to the gate electrode and a drain electrode connecting portion electrically connected to the drain electrode are respectively formed by using the via holes — S211

FIG. 2

FOLDED CHANNEL GALLIUM NITRIDE BASED FIELD-EFFECT TRANSISTOR AND METHOD OF MANUFACTURING THE SAME

CROSS-REFERENCE TO RELATED APPLICATION

This application claims the priority of Chinese Patent Application No. 202310431333.9 filed on Apr. 21, 2023 in the China National Intellectual Property Administration, the content of which is incorporated herein by reference in entirety.

TECHNICAL FIELD

At least one embodiment of the present disclosure relates to a field-effect transistor, in particular to a folded channel gallium based field-effect transistor and a method of manufacturing the same.

BACKGROUND

GaN materials have a large band gap, a high electron saturation rate and a high breakdown electric field, and have a good corrosion resistance, a good radiation resistance and a high thermal conductivity. GaN materials have significant advantages in high-frequency, high-power, radiation, and high-temperature conditions. In addition, an Al (In, Ga)N/GaN heterojunction may spontaneously form two-dimensional electron gas (2DEG) with high concentration and high electron mobility due to strong spontaneous polarization and piezoelectric polarization effects.

However, in traditional Al (In, Ga)N/GaN field-effect transistors, it is required to construct a relatively long, low doped N-drift region to ensure that the device has a sufficiently high breakdown voltage. Usually, a size of the low doped N-drift region is higher, a rated value of voltage is higher, but its conduction resistance increases sharply, and a conduction resistance decreases with an increase of voltage, resulting in a decrease in a rated value of current. In addition, in the traditional Al (In, Ga)N/GaN field-effect transistors, an area of the device will be increased with an increase of the size of the low doped N-drift region, thereby increasing a manufacturing cost of the device.

SUMMARY

In response to the above problems, embodiments of the present disclosure provide a folded channel gallium nitride based field-effect transistor and a method of manufacturing the same, which increase a breakdown voltage of the field-effect transistor and reduces a conduction resistance by increasing a size of a drifting region in a limited field-effect transistor structure.

Embodiments of a first aspect of the present disclosure provide a folded channel gallium nitride based field-effect transistor, including:

a base layer, including a nitride buffer layer and a gallium nitride semi-insulating layer formed sequentially on a substrate from bottom to top, where a channel region including at least one parallel extended groove is formed on an upper surface of the gallium nitride semi-insulating layer;

a multi-heterojunction layer, including a channel layer and a barrier layer alternatingly stacked from bottom to top on the gallium nitride semi-insulating layer, where a heterojunction is formed between the barrier layer and the channel layer that are adjacent;

a gallium nitride control layer on the multi-heterojunction layer and extending from one side of the channel region to at least a part of the groove, so as to adjust a charge balance within the channel region corresponding to on and off states of the field-effect transistor;

a current collapse suppression structure formed on the multi-heterojunction layer on another side of the channel region and separated from the gallium nitride control layer by another part of the groove; where the current collapse suppression structure is applicable to provide, when a voltage of a drain electrode is high, a hole injection to the drain electrode, so as to effectively release electrons captured near the drain electrode on a surface of the channel, suppress a current collapse effect, and improve dynamic conduction characteristics of the device;

a source electrode and the drain electrode that are respectively in contact with two sides of the multi-heterojunction layer on the gallium nitride semi-insulating layer, where the drain electrode is in contact with a side surface of the current collapse suppression structure and a part of an upper surface of the current collapse suppression structure;

a gate electrode formed on the multi-heterojunction layer between the source electrode and the gallium nitride control layer; and a connecting structure passing over the gate electrode to electrically connect to the source electrode and the gallium nitride control layer.

According to the embodiments of the present disclosure, in the multi-heterojunction layer, a thickness of the barrier layer is in a range of 1 nm to 50 nm, and a thickness of the channel layer is in a range of 5 nm to 500 nm.

Preferably, a material of the barrier layer is one of AlN, AlGaN, AlInN, or AlInGaN.

According to the embodiments of the present disclosure, the gallium nitride control layer includes a lightly doped P-type gallium nitride layer and a heavily doped P-type gallium nitride layer stacked from bottom to top, and the current collapse suppression structure includes a lightly doped P-type gallium nitride layer and a heavily doped P-type gallium nitride layer stacked from bottom to top.

Preferably, a thickness of the lightly doped P-type gallium nitride layer is in a range of 3 nm to 150 nm, and a thickness of the heavily doped P-type gallium nitride layer is in a range of 5 nm to 30 nm.

According to the embodiments of the present disclosure, a cross-sectional area of each groove is set as an inverted trapezoid; and an etching angle of a bottom of each groove is set between 90 degrees and 180 degrees.

Preferably, a depth of each groove is in a range of 0.1 μm to 5 μm; and an etching angle of each groove is in a range of 95 degrees to 175 degrees.

According to the embodiments of the present disclosure, a material of the source electrode is an ohmic contact metal, a material of the drain electrode is an ohmic contact metal, and a material of the gate electrode is a schottky contact metal.

Preferably, the ohmic contact metal includes at least one of Ti, Al, Ni or Au.

The schottky contact metal includes at least one of Pt. Ti, Al, Ni or TiN.

According to the embodiments of the present disclosure, the folded channel gallium nitride based field-effect transistor further includes:

a gate dielectric disposed between the gate electrode and the multi-heterojunction layer, and disposed on the source electrode, the drain electrode, the gallium nitride control layer, the current collapse suppression structure and an exposed multi-heterojunction layer;

where the gate dielectric includes one of aluminum oxide, aluminum nitride, silicon oxide or silicon nitride.

According to the embodiments of the present disclosure, the folded channel gallium nitride based field-effect transistor further includes:

a passivation dielectric layer formed on the gate dielectric and an exposed multi-heterojunction layer;

where a material of the passivation dielectric layer is at least one of aluminum oxide, aluminum nitride, silicon oxide or silicon nitride.

According to the embodiments of the present disclosure, an auxiliary groove which matches with a shape of the groove is formed in the multi-heterojunction layer.

A second aspect of the present disclosure provides a method of manufacturing a folded channel gallium nitride based field-effect transistor, including:

forming a nitride buffer layer and a gallium nitride semi-insulating layer on a substrate sequentially from bottom to top;

forming a channel region including at least one groove on an upper surface of the gallium nitride semi-insulating layer by using an etching process;

depositing an alternating material layer including a barrier layer and a channel layer alternately stacked on a surface which has the groove, and depositing a gallium nitride doped layer on the alternating material layer;

performing an etching process on the gallium nitride doped layer to expose a part of the alternating material layer, so as to obtain a gallium nitride control layer and a current collapse suppression structure, where the gallium nitride control layer is extended from one side of the channel region to at least a part of the groove, the current collapse suppression structure is formed on the other side of the channel region and separated from the gallium nitride control layer by another part of the groove;

performing an etching process on the exposed alternating material layer to expose a part of the gallium nitride semi-insulating layer on two sides of the alternating material layer, so as to obtain a multi-heterojunction layer;

depositing a source electrode on two sides of the hetero-junction and depositing a drain electrode on an exposed gallium nitride semi-insulating layer;

obtaining a gate groove by using an etching process on an exposed multi-heterojunction layer;

depositing a gate dielectric on the source electrode, the drain electrode, the gallium nitride control layer, the current collapse suppression structure, the gate groove and the exposed multi-heterojunction layer;

depositing a gate metal on the gate dielectric in the gate groove;

depositing a passivation dielectric layer on the exposed gallium nitride semi-insulating layer, the gate metal and the gate dielectric, and forming via holes on a part of the passivation dielectric layer aligned with the source electrode, the gate electrode, the gallium nitride control layer and the drain electrode by using an etching process; and respectively forming a connecting structure electrically connected to the source electrode and the gallium nitride control layer, a gate connecting portion electrically connected to the gate electrode, and a drain electrode connecting portion electrically connected to the drain electrode by using the via holes.

According to the embodiments of the present disclosure, a barrier layer and a channel layer are provided between a bottom of the gate groove and the gallium nitride semi-insulating layer, and a distance between the bottom of the gate groove and an upper surface of a last barrier layer from top to bottom is in a range of 0 to 20 nm; or the bottom of the gate groove is located within the last barrier layer from top to bottom, and a distance between the bottom of the gate groove and a bottom surface of the last barrier layer from top to bottom is in a range of 0 to 5 nm.

BRIEF DESCRIPTION OF DRAWINGS

Through the following description of embodiments of the present disclosure with reference to the accompanying drawings, the above contents and other objects, features and advantages of the present disclosure will be more clearly, in which:

FIG. 2 schematically shows a flowchart of a method of manufacturing a folded channel gallium nitride based field-effect transistor according to an embodiment of the present disclosure;

Meanings of corresponding reference numerals in the above drawings are as follows:

1: Substrate;
2: Nitride buffer layer;
3: Gallium nitride semi-insulating layer;
4: Multi-heterojunction layer;
5: Gallium nitride control layer;
51: Lightly doped P-type gallium nitride layer;
52: Heavily doped P-type gallium nitride layer;
6: Current collapse suppression structure;
7: Source electrode;
8: Drain electrode;
9: Gate dielectric;
10: Gate electrode;
11: Passivation dielectric layer;
12: Connecting structure.

DETAILED DESCRIPTION OF EMBODIMENTS

Hereinafter, embodiments of the present disclosure will be described with reference to accompanying drawings. However, it should be understood that these descriptions are only illustrative and are not intended to limit the scope of the present disclosure. In the following detailed description, for convenience of explanation, many specific details are described to provide a comprehensive understanding of embodiments of the present disclosure. However, it is obvious that one or more embodiments may also be implemented without these specific details. In addition, in the following description, description of the well-known structure and technology is omitted to avoid unnecessarily confusing concepts of the present disclosure.

The terms used herein are only intended to describe specific embodiments and are not intended to limit the present disclosure. The terms "comprise", "include", "contain", etc., used herein indicate the existence of the described feature, step, operation and/or component, but do not exclude the existence or addition of one or more other features, steps, operations or components.

All terms (including technical and scientific terms) used herein have meanings generally understood by those skilled in the art, unless otherwise defined. It should be noted that the terms used here should be interpreted as having the meaning consistent with the context of this specification, and should not be interpreted in an idealized or too rigid way.

In a case of using an expression similar to "at least one selected from A. B, or C", it should generally be interpreted in accordance with the meaning of the expression generally understood by those skilled in the art (for example, "a system having at least one of A, B and C" should include, but not be limited to, a system having A alone, a system having B alone, a system having C alone, a system having A and B, a system having A and C, a system having B and C, and/or a system having A, B, and C, etc.).

In order to make the purpose, technical solutions and advantages of the present disclosure clearer, the present disclosure will be further described in detail below in conjunction with specific embodiments and with reference to the accompanying drawings.

Figure 1:
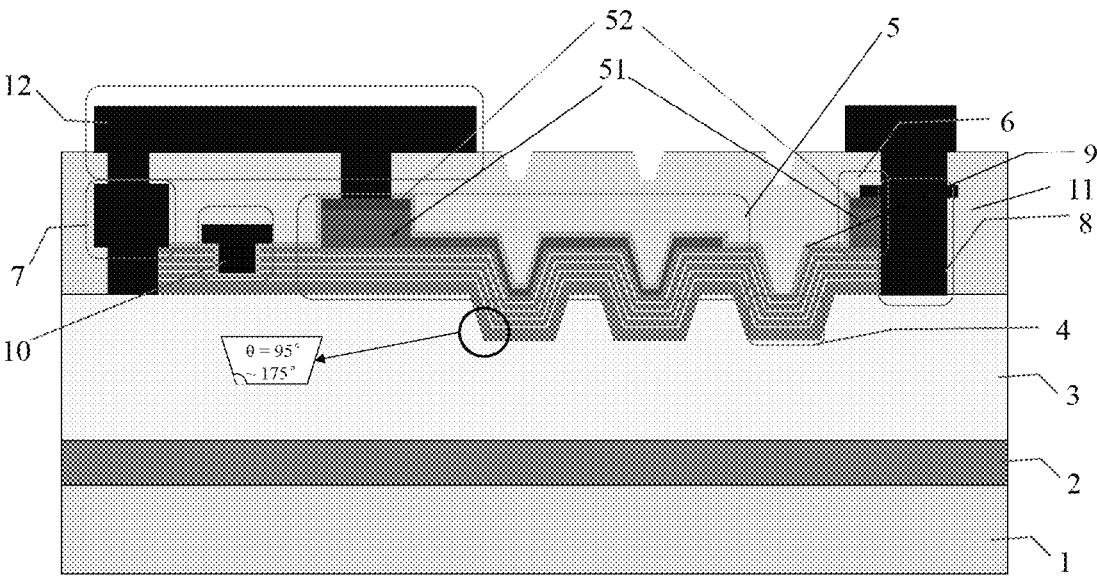
FIG. 1 schematically shows a cross-sectional diagram of a folded channel gallium nitride based field-effect transistor according to an embodiment of the present disclosure.

FIG. 1 schematically shows a cross-sectional diagram of a folded channel gallium nitride based field-effect transistor according to an embodiment of the present disclosure.

As shown in FIG. 1, the exemplary embodiment of the present disclosure provides a folded channel gallium nitride based field-effect transistor, including a base layer, a multi-heterojunction layer 4, a gallium nitride control layer 5, a current collapse suppression structure 6, a source electrode 7, a drain electrode 8, a gate electrode 10, and a connecting structure 12. The base layer includes a nitride buffer layer 2 and a gallium nitride semi-insulating layer 3 formed sequentially on a substrate 1 from bottom to up. A channel region including at least one parallel extended groove is formed on an upper surface of the gallium nitride semi-insulating layer 3. The multi-heterojunction layer 4 includes a channel layer and a barrier layer alternatingly stacked from bottom to top on the gallium nitride semi-insulating layer 3. A heterojunction is formed between the barrier layer and the channel layer that are adjacent. From bottom to top, the channel layer and the barrier layer adjacent to the channel layer form a group. The gallium nitride control layer 5 on the multi-heterojunction layer 4 extends from one side of the channel region to at least a part of the groove, so as to adjust a charge balance within the channel region corresponding to on and off states of the field-effect transistor. The current collapse suppression structure 6 is formed on the multi-heterojunction layer 4 on another side of the channel region, and is separated from an auxiliary depletion structure/a charge neutralization structure by another part of the groove. The current collapse suppression structure 6 is applicable to provide, when a voltage of a drain electrode 8 is high, a hole injection to the drain electrode, so as to effectively release electrons captured near the drain electrode on a surface of channel, suppress a current collapse effect, and improve dynamic conduction characteristics of the device. The gate electrode 10 is formed on the multi-heterojunction layer 4 between the source electrode and the gallium nitride control layer 5. The connecting structure 12 passes over the gate electrode 10 to electrically connect to the source electrode 7 and the gallium nitride control layer 5. The connecting structure 12 is applicable to adjust a voltage applied on the gallium nitride control layer 5 to be the same as a voltage applied on the source electrode 7, corresponding to the field-effect transistor in an off state.

According to the embodiments of the present disclosure, first, the upper surface of the gallium nitride semi-insulating layer 3 is constructed as a channel region including at least one groove extending in parallel. Secondly, the stacked multi-heterojunction layer 4 is combined with a multi-channel technology, so that multiple groups of channel layers and barrier layers are folded longitudinally along the multi-groove located in a voltage resistance region between the gate electrode 10 and the drain electrode 8, thereby increasing a space between the gate electrode 10 and the drain electrode 8. In this way, it is possible to increase a size of the drifting region (i.e. the space between the gate electrode 10 and the drain electrode 8) in a limited field-effect transistor structure, thereby increasing the breakdown voltage of the field-effect transistor.

According to the embodiments of the present disclosure of the folded channel gallium nitride based field-effect transistor, the upper surface of the gallium nitride semi-insulating layer 3 is configured to have the channel region including at least one groove extending in parallel, and the stacked multi-heterojunction layer 4 is combined with the multi-groove. In this way, multiple groups of channel layers and barrier layers are folded longitudinally in the channel region, thereby increasing the space between the gate electrode 10 and the drain electrode 8, increasing the size of the drifting region in the field-effect transistor structure, and improving the breakdown voltage of the field-effect transistor. By configuring the stacked multi-heterojunction layers 4 to alternating stacked multiple groups of channel layers and barrier layers, multi-layer two-dimensional electron gas may be achieved, so as to ensure the parallel conduction of current in the field-effect transistor. Due to a high carrier mobility of two-dimensional electron gas and a presence of multi-groove in the channel region, a concentration of the two-dimensional electron gas may be increased, so that a carrier density within a same cross-section may be correspondingly increased. When the field-effect transistor is turned on, the field-effect transistor has a high conductivity (i.e., having a greater conduction current), and the conduction resistance is reduced by the high carrier density.

According to the folded channel gallium nitride based field-effect transistor of the embodiments of the present disclosure, by introducing a combination technology of multi-groove and the stacked multi-heterojunction layer 4, the size of the field-effect transistor is reduced under a same voltage withstand characteristic condition, thereby improving an integration degree of the field-effect transistor.

According to the embodiments of the present disclosure, in the multi-heterojunction layer 4, a thickness of each barrier layer is in a range of 1 nm to 50 nm, such as 1 nm, 5 nm, 10 nm, 15 nm, 20 nm, 25 nm, 30 nm, 35 nm, 40 nm, 45 nm, or 50 nm. A thickness of the channel layer is in a range of 5 nm to 500 nm, such as 5 nm, 20 nm, 50 nm, 80 nm, 100 nm, 150 nm, 200 nm, 250 nm, 300 nm, 350 nm, 400 nm, 450 nm, or 500 nm.

According to the embodiments of the present disclosure, a material of the channel layer is one of AlN, AlGaN, AlInN, or AlInGaN.

According to the embodiments of the present disclosure, under the influence of piezoelectric polarization, the thickness of each barrier layer and the change of Al composition in the barrier layer will lead to a corresponding change of the two-dimensional electron gas concentration formed by the multi-heterojunction layer 4.

According to the embodiments of the present disclosure, the gallium nitride control layer 5 includes a lightly doped P-type gallium nitride layer 51 and a heavily doped P-type gallium nitride layer 52 stacked from bottom to top. The current collapse suppression structure 6 includes a lightly doped P-type gallium nitride layer 51 and a heavily doped P-type gallium nitride layer 52 stacked from bottom to top.

Preferably, a thickness of the lightly doped P-type gallium nitride layer 51 is in a range of 3 nm to 150 nm, such as 3 nm, 10 nm, 20 nm, 30 nm, 40 nm, 50 nm, 60 nm, 70 nm, 80 nm, 90 nm, 100 nm, 110 nm, 120 nm, 130 nm, 140 nm, or 150 nm. A thickness of the heavily doped P-type gallium nitride layer 52 is in a range of 5 nm to 30 nm, such as 5 nm, 8 nm, 11 nm, 14 nm, 17 nm, 20 nm, 23 nm, 27 nm, or 30 nm.

According to the embodiments of the present disclosure, the gallium nitride control layer 5 in the scheme uses the P-type doped gallium nitride layer to deplete with carriers in the channel and perform a charge neutralization (hence, the gallium nitride control layer 5 is also referred to as an auxiliary depletion structure and a charge neutralization structure), so as to evenly distribute the electric field in multi-channel, thereby forming a large depletion region in the drifting region of the field-effect transistor, and further increasing the breakdown voltage. The current collapse suppression structure 6 may provide the hole injection after the high drain electrode voltage is stressed, so as to effectively release electrons captured near the drain electrode 8 on the surface of the channel, suppress the current collapse effect, and improve the dynamic conduction characteristics of the device.

According to the embodiments of the present disclosure, a cross-sectional area of each groove is set as an inverted trapezoid, and an etching angle of a bottom of each groove is set between 90 degrees and 180 degrees. For example, it may be 95 degrees, 100 degrees, 105 degrees, 110 degrees, 115 degrees, 120 degrees, 125 degrees, 130 degrees, 135 degrees, 140 degrees, 145 degrees, 150 degrees, 160 degrees, and 170 degrees. According to the embodiments of the present disclosure, a depth of each groove is in a range of 0.1 μm to 5 μm, for example, 0.1 μm, 0.5 μm, 1 μm, 1.5 μm, 2 μm, 2.5 μm, 3 μm, 3.5 μm, 4 μm, 4.5 μm or 5 μm. The etching angle of each groove is in a range of 95 degrees to 175 degrees, more preferably 120 degrees to 150 degrees, so as to ensure that the two-dimensional electron gas concentration in multi-groove is sufficiently high.

According to the embodiments of the present disclosure, a material of the source electrode 7 is an ohmic contact metal, a material of the drain electrode 8 is an ohmic contact metal, and a material of the gate electrode 10 is a schottky contact metal. In some embodiments, the ohmic contact metal includes at least one of Ti, Al, Ni, or Au, such as Ti/Al, Ti/Al/Ni/Au, Ti/Al/Ti/Au, etc. The schottky contact metal includes at least one of Pt, Ti, Al, Ni, or TiN, such as Ni/Au and Ti/Au, etc.

According to the embodiments of the present disclosure, the folded channel gallium nitride based field-effect transistor further includes a gate dielectric 9. The gate dielectric 9 is disposed between the gate electrode 10 and the multi-heterojunction layer 4, and disposed on the source electrode 7, the drain electrode 8, the gallium nitride control layer 5, the current collapse suppression structure 6 and an exposed multi-heterojunction layer 4. The gate dielectric 9 includes one of aluminum oxide, aluminum nitride, silicon oxide or silicon nitride.

According to the embodiments of the present disclosure, the folded channel gallium nitride based field-effect transistor further includes a passivation dielectric layer 11 formed on the gate dielectric layer 9 and an exposed multi-heterojunction layer 4. A material of the passivation medium layer 11 is at least one of aluminum oxide, aluminum nitride, silicon oxide or silicon nitride.

According to the embodiments of the present disclosure, an auxiliary groove which matches with a shape of the groove is formed in the multi-heterojunction layer 4.

According to the embodiments of the present disclosure, a working principle of a folded channel gallium nitride based field-effect transistor is as follows: using the multi-heterojunction layer 4 to generate a multi-layer two-dimensional electron gas, and adjusting the drain electrode voltage to generate a transverse electric field in the channel region on the surface of the gallium nitride semi-insulating layer 3. Under an action of the transverse electric field, the multi-layer two-dimensional electron gas undergoes transverse transport along the multi-heterojunction layer 4, so as to generate an output current of the drain electrode 8. By adjusting a depth of potential well in the heterojunction through the gate electrode voltage, a density of the multi-layer two-dimensional electron gas may be changed, so as to control the output current through the drain electrode 8 in the multi-channel.

Specifically, an operating state of the gallium nitride based field-effect transistor is divided into an on (turn-on) state and a close (turn-off) state. Generally, when a voltage of the gate electrode of the gallium nitride based field-effect transistor (in a case that the source electrode 7 is grounded, the voltage between the gate electrode 10 and the source electrode 7 is usually referred to the voltage of the gate electrode) is greater than a threshold voltage (on voltage), the gallium nitride based field-effect transistor is in a conduction state. When a voltage of the gate electrode is less than the threshold voltage, the gallium nitride based field-effect transistor is in the turn-off state. The threshold voltage of the folded channel gallium nitride based field-effect transistor is influenced by various factors such as the thickness of the barrier layer, a gate groove etching depth, and a gate metal composition.

When the folded channel gallium nitride based field-effect transistor is in a conduction state, that is, when the voltage of the gate electrode is greater than the threshold voltage, as the voltage of the drain electrode (in the case that the source electrode 7 is grounded, the voltage between the drain electrode 8 and the source electrode 7 is usually referred to as the voltage of the drain electrode) increases, the multi-layer two-dimensional electron gas in the multi-channel will experience high-speed saturation. In this way, a conduction current of the folded channel gallium nitride based field-effect transistor is increased and saturated with the increase of the voltage of the drain electrode, and an output curve similar to the metal oxide semiconductor field-effect transistor is presented. Compared to a traditional single channel transverse gallium nitride based field-effect transistor, the multi-channel structure makes the conduction current of the folded channel gallium nitride based field-effect transistor larger, thereby obtaining lower conduction resistance.

When the folded channel gallium nitride based field-effect transistor is in a turn-off state, that is, when the voltage of the gate electrode is less than the threshold voltage, as the voltage of the drain electrode increases, the gallium nitride control layer 5 extends from the gate electrode 10 to a side of the gate electrode 8, and points towards an edge of the gate electrode 10 starting from an electric field line generated by fixed positive charges, so that a high electric field peak is generated at the edge of the gate electrode 10. After exceeding a critical electric field, the charge carriers in a space charge region are accelerated and energized by the electric field, thereby ultimately leading to a rapid increase in current and ultimately causing a breakdown of the folded channel gallium nitride based field-effect transistor.

FIG. 2 schematically shows a flowchart of a method of manufacturing a folded channel gallium nitride based field-effect transistor according to an embodiment of the present disclosure.

As shown in FIG. 2, the method of manufacturing a folded channel gallium nitride based field-effect transistor includes steps S201 and S210. FIGS. 3A to 3K schematically show cross-sectional diagrams obtained after performing some steps in a method of manufacturing a folded channel gallium nitride based field-effect transistor according to an embodiment of the present disclosure.

Figure 3A:
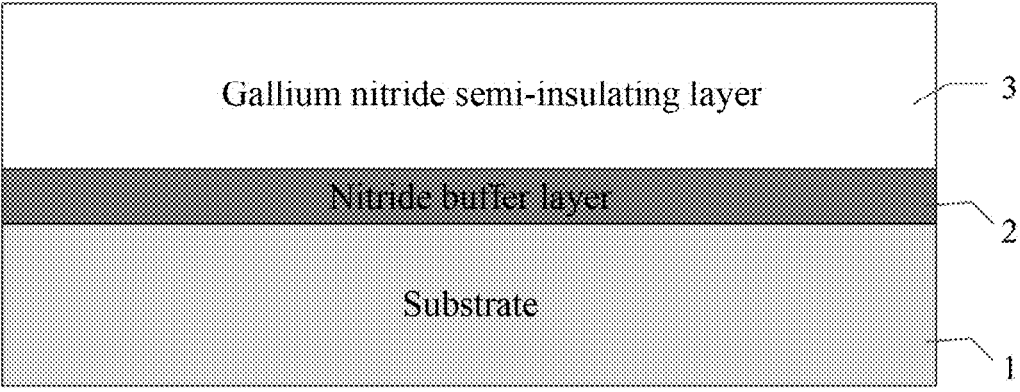
FIGS. 3A to 3K schematically show cross-sectional diagrams obtained after performing some steps in a method of manufacturing a folded channel gallium nitride based field-effect transistor according to an embodiment of the present disclosure.

In step S201, as shown in FIG. 3A, a nitride buffer layer 2 and a gallium nitride semi-insulating layer 3 are sequentially formed on a substrate 1 from bottom to top. Specifically, an aluminum nitride nucleation layer, a gallium nitride buffer layer, and the gallium nitride semi-insulating layer 3 formed by a carbon-doped gallium nitride (Carbon-doped GaN) are sequentially formed on the substrate 1.

Figure 3B:
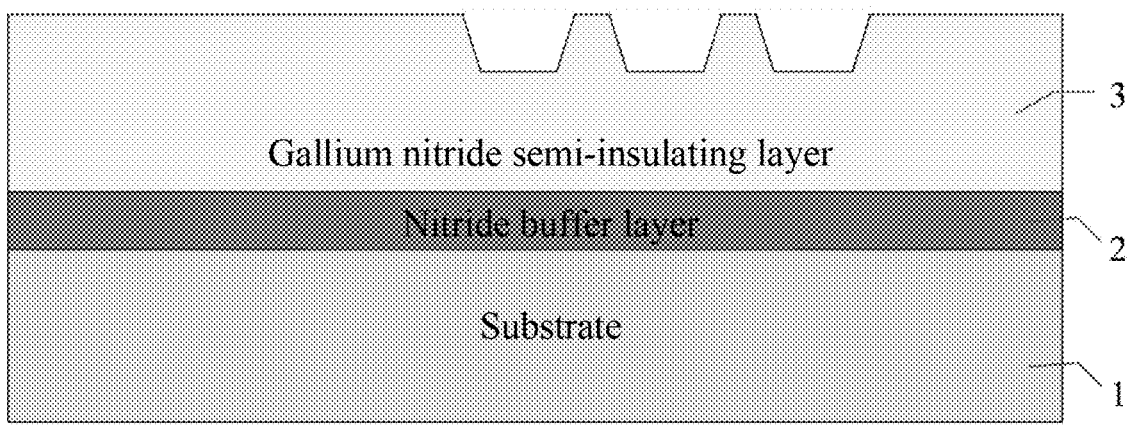

In step S202, as shown in FIG. 3B, a channel region including at least one groove is formed on an upper surface of the gallium nitride semi-insulating layer 3 by using an etching process.

Figure 3C:
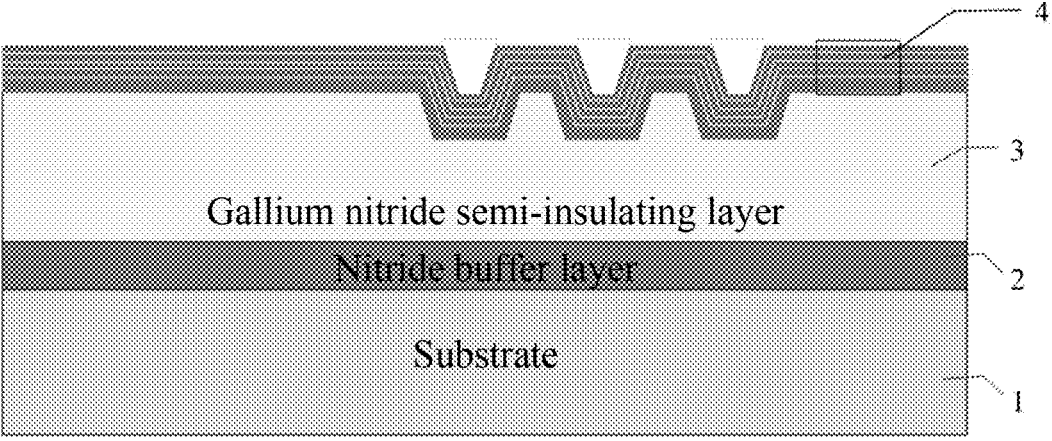

In step S203, as shown in FIG. 3C, an alternating material layer including a channel layer and a barrier layer alternately stacked, is deposited on a surface, which has multiple grooves. Subsequently, as shown in FIG. 3D, a gallium nitride doped layer is deposited on the alternating material layer.

Figure 3D:
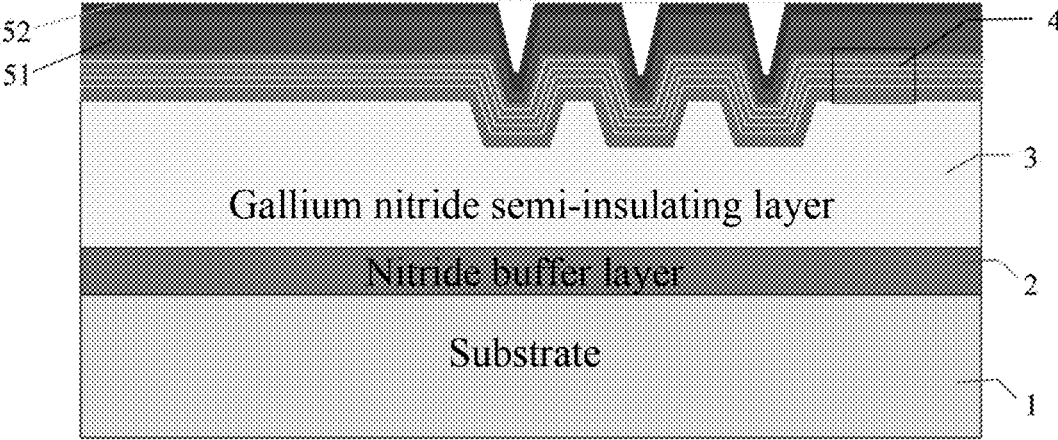
Figure 3E:
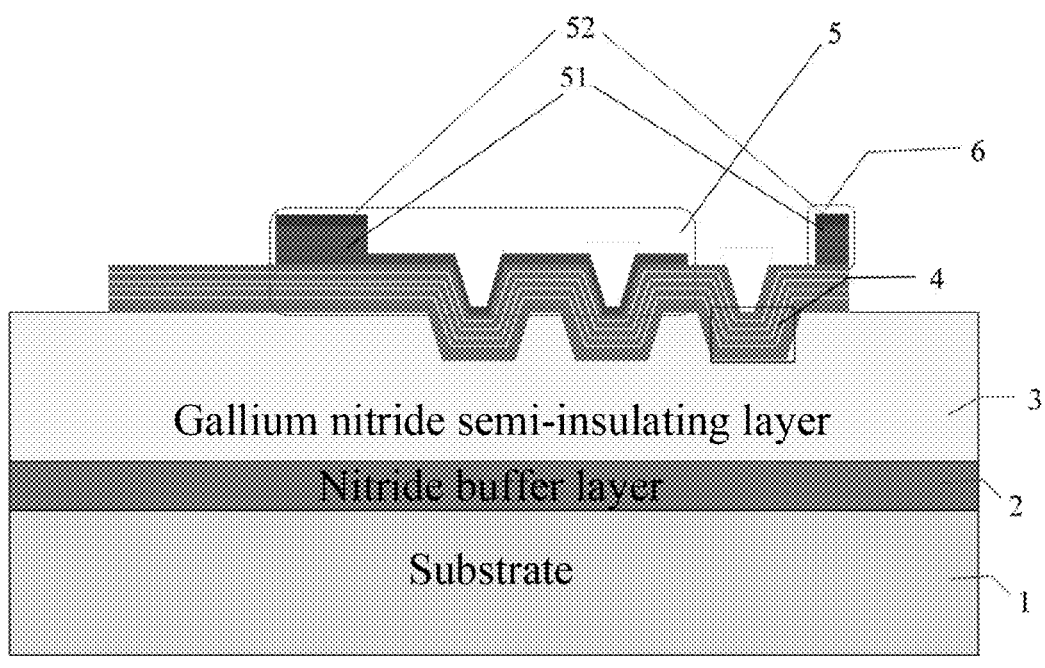

In step S204, as shown in FIG. 3E, an etching process is performed on the gallium nitride doped layer to expose a part of the alternating material layer, so as to obtain a gallium nitride control layer and a current collapse suppression structure. The gallium nitride control layer is extended from one side of the channel region to at least a part of the groove, the current collapse suppression structure is formed on the other side of the channel region and separated from the gallium nitride control layer by another part of the groove.

In step S205, with continued reference to FIG. 3E, an etching process is performed on the exposed alternating material layer to expose a part of the gallium nitride semi-insulating layer on two sides of the alternating material layer, so as to obtain a multi-heterojunction layer.

According to the embodiments of the present disclosure, when steps S204 to S205 are performed, first with reference to FIG. 3D, a lightly doped P-type gallium nitride (P–-GaN) layer and a heavily doped P-type gallium nitride (P+-GaN) layer stacked from bottom to top are deposited on the alternating material layer. Secondly, with reference to FIG. 3E, an etching (mesa isolation etching) process is performed on the alternating material layer on the heavily doped P-type gallium nitride layer 52, so as to indirectly perform the etching process on the alternating material layer, remove parts of the lightly doped P-type gallium nitride layer 51 and the heavily doped P-type gallium nitride layer 52, and expose a part of the alternating material layer, thereby obtaining the gallium nitride control layer.

Figure 3F:
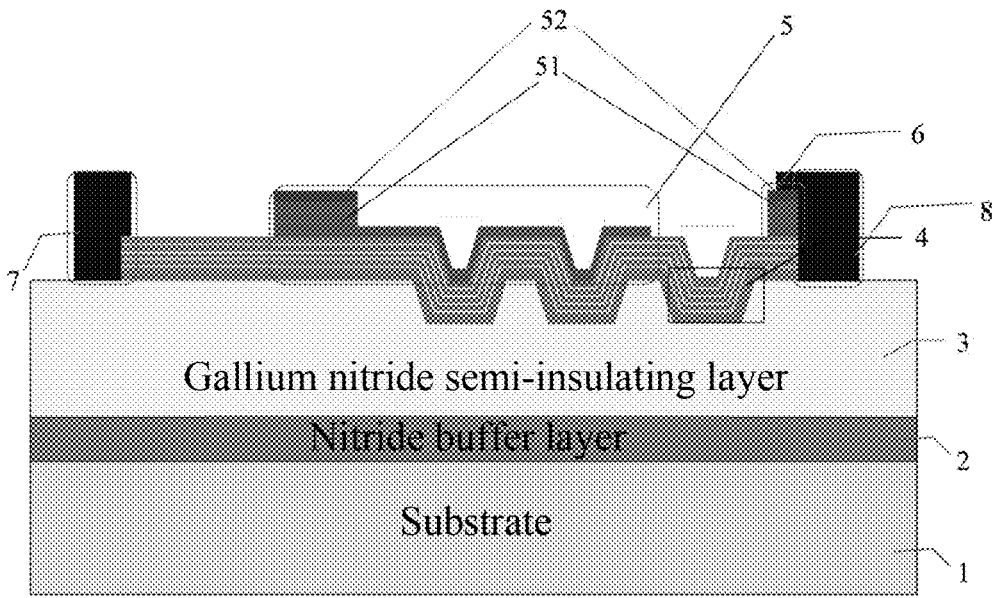

In step S206, as shown in FIG. 3F, a source electrode is deposited on two sides of the multi-heterojunction layer 4 and a drain electrode is deposited on an exposed gallium nitride semi-insulating layer.

Figure 3G:
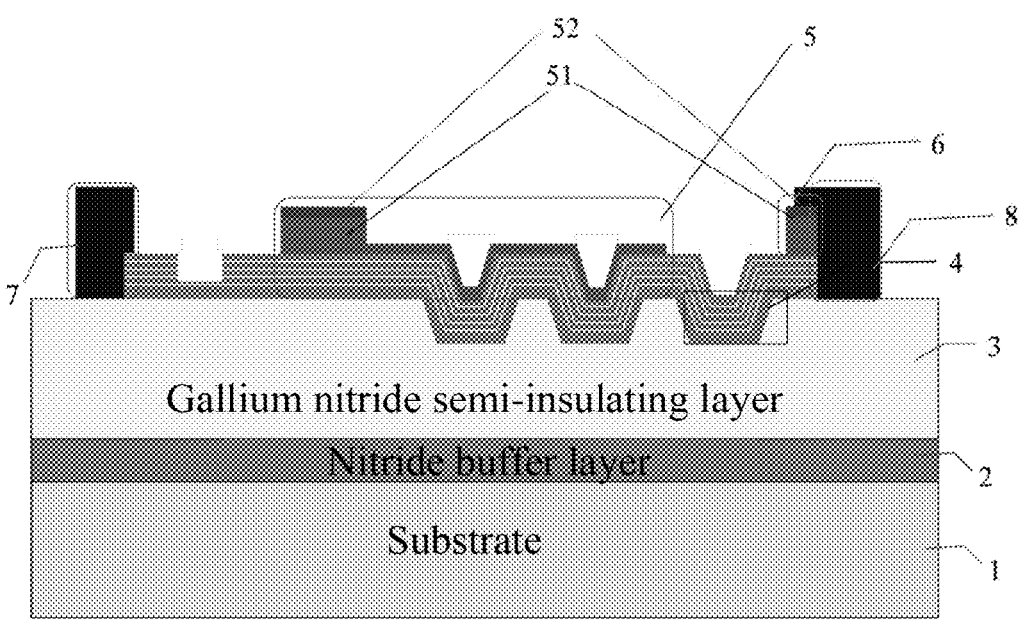

In step S207, as shown in FIG. 3G, a gate groove is obtained by using an etching process on an exposed multi-heterojunction layer 4.

Figure 3H:
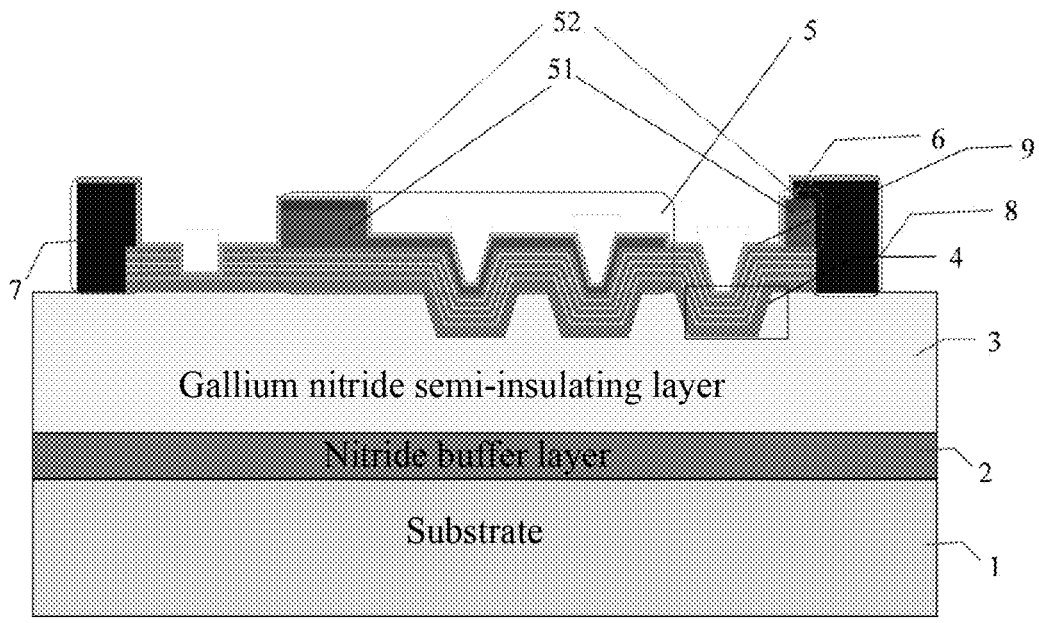

In step S208, as shown in FIG. 3H, a gate dielectric is deposited on the source electrode, the drain electrode, the gallium nitride control layer, the current collapse suppression structure, the gate groove and the exposed multi-heterojunction layer 4.

Figure 3I:
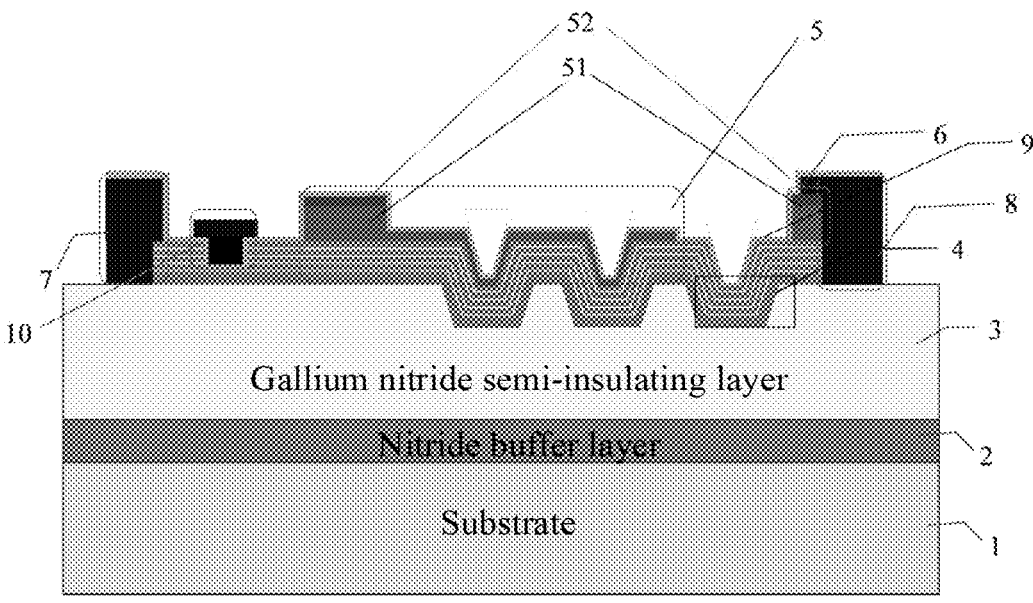

In step S209, as shown in FIG. 3I, a gate metal is deposited on the gate dielectric in the gate groove to form a gate electrode 10.

According to the embodiments of the present disclosure, in the final formed field-effect transistor, a groove located between the gate electrode 10 and the drain electrode 8 forms a voltage withstand region, and the multi-heterojunction layer 4 of the voltage withstand region between the gate electrode 10 and the drain electrode 8 is partially covered with the gallium nitride control layer 5 (auxiliary depletion structure/charge neutralization structure) formed by the lightly doped P-type gallium nitride layer 51.

According to the embodiments of the present disclosure, the source electrode 7 and the drain electrode 8 form a two-dimensional electron gas (2DEG) channel through a side contact with the multi-heterojunction layer 4. The gate electrode 10 may be a metal-insulator-semiconductor (MIS) structure gate formed by etching (n-1) multi-heterojunction layers 4. The gallium nitride control layer 5 (the auxiliary depletion structure/charge neutralization structure) is located between the gate electrode 10 and the drain electrode 8.

Figure 3J:
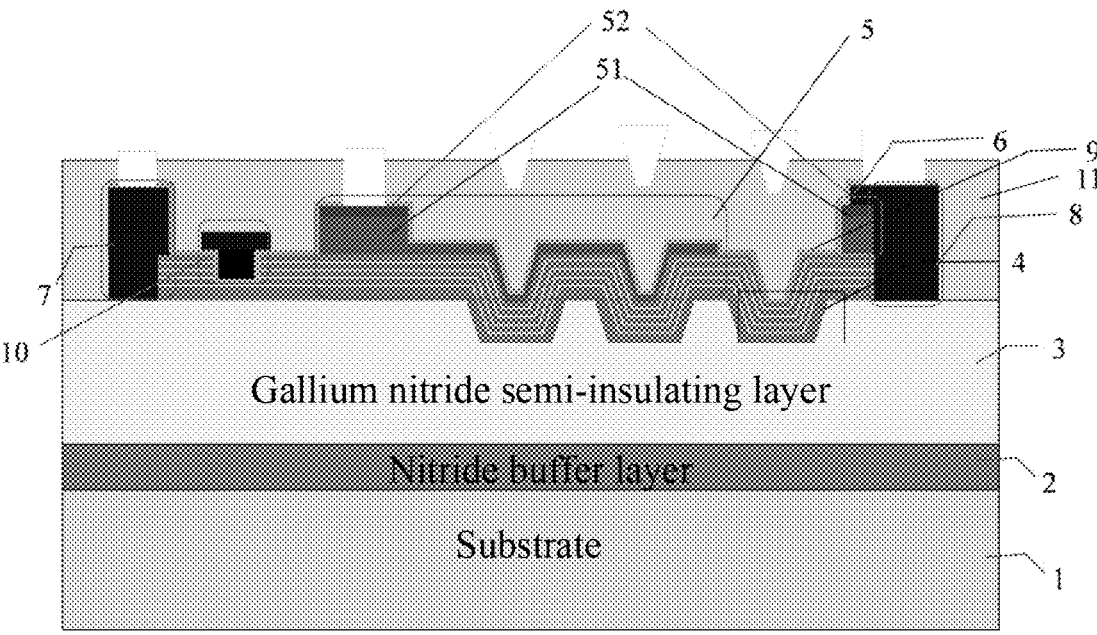

In step S210, as shown in FIG. 3J, a passivation dielectric layer 11 is deposited on the exposed gallium nitride semi-insulating layer 3, the gate metal and the gate dielectric 9. Via holes are formed on a part of the passivation dielectric layer aligned with the source electrode 7, the gate electrode 10, the gallium nitride control layer 5 and the drain electrode 8 by using an etching process. The gate dielectric 9 grown after etching the gate electrode 10 groove may be aluminum oxide $Al_2O_3$ or aluminum nitride AlN. The passivation dielectric layer 11 may be silicon oxide $SiO_2$ or silicon nitride $SiN_x$ or a combination of both. The via holes on the passivation dielectric layer 11 may be formed by F-based or CI based plasma etching.

According to the embodiments of the present disclosure, the gate dielectric 9 grown after etching the gate electrode groove may be aluminum oxide $Al_2O_3$ or aluminum nitride AlN. The passivation dielectric layer may be silicon oxide $SiO_2$ or silicon nitride $SiN_x$ or a combination of both. The via holes on the passivation dielectric layer 11 may be formed by F-based or CI based plasma etching.

Figure 3K:
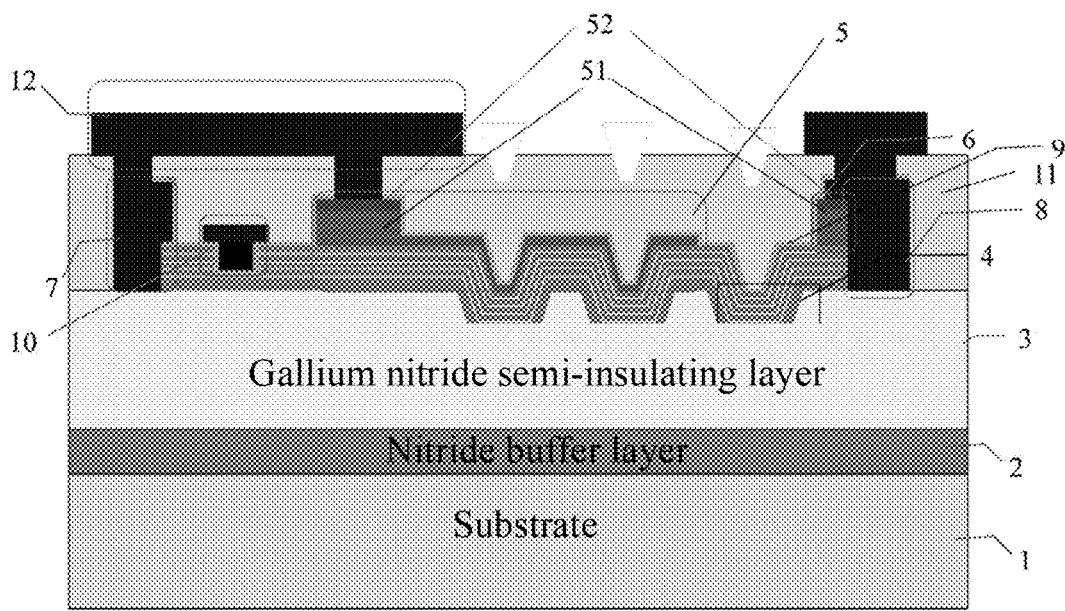

In step S211, with reference to FIG. 3K, a connecting structure electrically connected to the source electrode and the gallium nitride control layer, a gate connecting portion electrically connected to the gate electrode and a drain electrode connecting portion electrically connected to the drain electrode are respectively formed by using the via holes. In this way, the heavily doped P-type gallium nitride layer 52 (P+-GaN) in the gallium nitride control layer 5 forms an electrical connection with the source electrode 7 by passing over the gate electrode 10 through the connecting structure 12.

Figure 4:
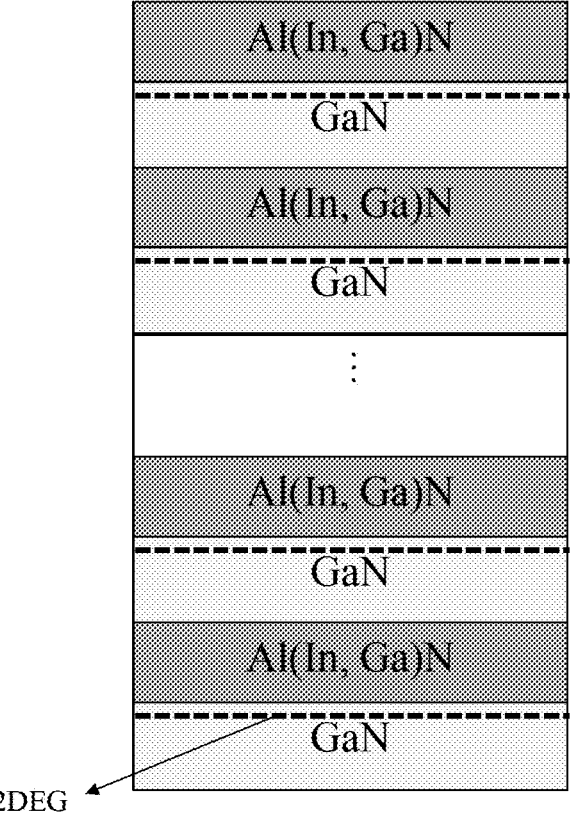
FIG. 4 schematically shows a cross-sectional diagram of a multi-heterojunction layer of a folded channel gallium nitride based field-effect transistor according to an embodiment of the present disclosure.

FIG. 4 schematically shows a cross-sectional diagram of a multi-heterojunction layer of a folded channel gallium nitride based field-effect transistor according to an embodiment of the present disclosure.

Figure 5:
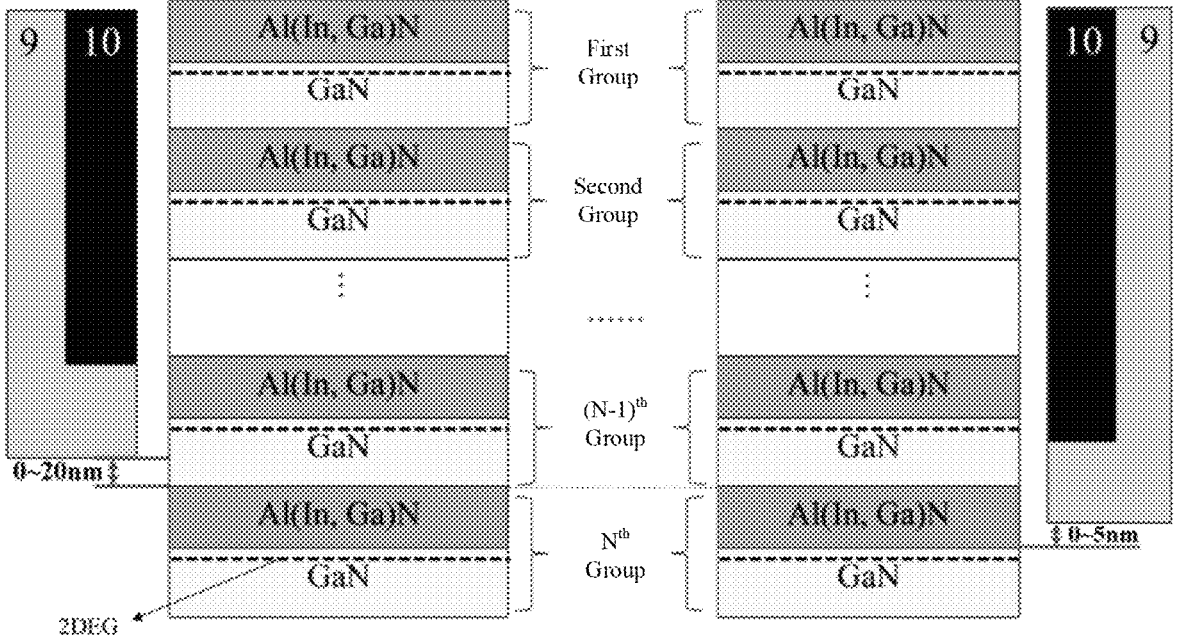
FIG. 5 schematically shows two cross-sectional diagrams of gate grooves of a folded channel gallium nitride based field-effect transistor according to an embodiment of the present disclosure.

FIG. 5 schematically shows two cross-sectional diagrams of gate grooves of a folded channel gallium nitride based field-effect transistor according to an embodiment of the present disclosure.

As shown in FIG. 4 to FIG. 5, by taking Al (In, Ga) N as the barrier layer and choosing GaN as a material of the channel layer, a barrier layer and a channel layer are provided between a bottom of the gate 10 groove and the gallium nitride semi-insulating layer 3. A distance between the bottom of the gate 10 groove and an upper surface of a last barrier layer is in a range of 0 to 20 nm. Alternatively, the bottom of the gate 10 groove is located within the last barrier layer from top to bottom, and a distance between the bottom of the gate 10 groove and a bottom surface of the last barrier layer from top to bottom is in a range of 0 to 5 nm.

According to the embodiments of the present disclosure, the gate electrode 10 structure is designed as a metal-insulator-semiconductor structure by the folded channel gallium nitride based field-effect transistor of this scheme, which is specifically achieved by etching different materials in the multi-heterojunction layer 4. According to different etching depths of the gate electrode 10 groove, an adjustment effect on the two-dimensional electron gas in the multi-channel is also different. It is generally believed that the etching depth of the gate electrode 10 groove is higher, so that the threshold voltage of the field-effect transistor is higher.

The folded channel gallium nitride based field-effect transistor proposed in this scheme simultaneously achieves advantages of low conduction resistance, high breakdown voltage, and small size and high integration of the gallium nitride based field-effect transistor, thereby providing a feasible plan for an industrial development of the gallium nitride based field-effect transistor.

The specific embodiments mentioned above provide further detailed explanations of the purpose, technical solution, and beneficial effects of the present disclosure. It should be understood that the above are only specific embodiments of the present disclosure and are not intended to limit the present disclosure. Any modifications, equivalent replacements, improvements, etc. made within spirits and principles of the present disclosure should be included in scope of protection of the present disclosure.

What is claimed is:

1. A folded channel gallium nitride based field-effect transistor, comprising:

a base layer, comprising a nitride buffer layer and a gallium nitride semi-insulating layer formed sequentially on a substrate from bottom to top, wherein a channel region comprising at least one parallel extended groove is formed on an upper surface of the gallium nitride semi-insulating layer;

a multi-heterojunction layer, comprising a channel layer and a barrier layer alternatingly stacked from bottom to top on the gallium nitride semi-insulating layer, wherein a heterojunction is formed between the barrier layer and the channel layer that are adjacent;

a gallium nitride control layer on the multi-heterojunction layer and extending from one side of the channel region to at least a part of the groove, so as to adjust a charge balance within the channel region corresponding to on and off states of the field-effect transistor;

a current collapse suppression structure formed on the multi-heterojunction layer on another side of the channel region and separated from the gallium nitride control layer by another part of the groove, wherein the current collapse suppression structure is applicable to provide, when a voltage of a drain electrode is high, a hole injection to the drain electrode, so that a charge balance on the drain electrode is achieved;

a source electrode and the drain electrode that are respectively in contact with two sides of the multi-heterojunction layer on the gallium nitride semi-insulating layer, wherein the drain electrode is in contact with a side surface of the current collapse suppression structure and a part of an upper surface of the current collapse suppression structure;

a gate electrode formed on the multi-heterojunction layer between the source electrode and the gallium nitride control layer; and a connecting structure passing over the gate electrode to electrically connect to the source electrode and the gallium nitride control layer.

2. The field-effect transistor of claim 1, wherein, in the multi-heterojunction layer, a thickness of the barrier layer is in a range of 1 nm to 50 nm, and a thickness of the channel layer is in a range of 5 nm to 500 nm;

a material of the barrier layer is one of AlN, AlGaN, AlInN, or AlInGaN.

3. The field-effect transistor of claim 1, wherein, the gallium nitride control layer comprises a lightly doped P-type gallium nitride layer and a heavily doped P-type gallium nitride layer stacked from bottom to top, and the current collapse suppression structure comprises a lightly doped P-type gallium nitride layer and a heavily doped P-type gallium nitride layer stacked from bottom to top;

a thickness of the lightly doped P-type gallium nitride layer is in a range of 3 nm to 150 nm, and a thickness of the heavily doped P-type gallium nitride layer is in a range of 5 nm to 30 nm.

4. The field-effect transistor of claim 1, wherein, a cross-sectional area of each groove is set as an inverted trapezoid; and an etching angle of a bottom of each groove is set between 90 degrees and 180 degrees;

a depth of each groove is in a range of 0.1 μm to 5 μm; and an etching angle of each groove is in a range of 95 degrees to 175 degrees.

5. The field-effect transistor of claim 1, wherein, a material of the source electrode is an ohmic contact metal, a material of the drain electrode is an ohmic contact metal, and a material of the gate electrode is a schottky contact metal;

the ohmic contact metal comprises at least one of Ti, Al, Ni or Au;

the schottky contact metal comprises at least one of Pt, Ti, Al, Ni or TiN.

6. The field-effect transistor of claim 1, further comprising:

a gate dielectric disposed between the gate electrode and the multi-heterojunction layer, and disposed on the source electrode, the drain electrode, the gallium nitride control layer, the current collapse suppression structure and an exposed multi-heterojunction layer;

wherein the gate dielectric comprises one of aluminum oxide, aluminum nitride, silicon oxide or silicon nitride.

7. The field-effect transistor of claim 1, further comprising:

a passivation dielectric layer formed on the gate dielectric and an exposed multi-heterojunction layer;

wherein a material of the passivation dielectric layer is at least one of aluminum oxide, aluminum nitride, silicon oxide or silicon nitride.

8. The field-effect transistor of claim 1, wherein an auxiliary groove which matches with a shape of the groove is formed in the multi-heterojunction layer.

\* \* \* \* \*